(12) United States Patent
Lin et al.

(10) Patent No.: US 6,943,111 B2
(45) Date of Patent: Sep. 13, 2005

(54) BARRIER FREE COPPER INTERCONNECT BY MULTI-LAYER COPPER SEED

(75) Inventors: Jing-Cheng Lin, Hsin Chu (TW); Cheng-Lin Huang, Taipei (TW); Winston Shue, Hsinchu (TW); Mong-Song Liang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 83 days.

(21) Appl. No.: 10/361,732

(22) Filed: Feb. 10, 2003

(65) Prior Publication Data

US 2004/0157431 A1 Aug. 12, 2004

(51) Int. Cl.7 .................... H01L 21/4763; H01L 21/44; H01L 21/302
(52) U.S. Cl. ................... 438/687; 438/637; 438/692
(58) Field of Search ................. 438/637–640, 438/678, 687, 692

(56) References Cited

U.S. PATENT DOCUMENTS

| | | | |
|---|---|---|---|
| 5,130,274 A | * | 7/1992 | Harper et al. ............... 438/624 |
| 5,789,320 A | * | 8/1998 | Andricacos et al. ........ 438/678 |
| 5,913,144 A | | 6/1999 | Nguyen et al. |
| 5,968,847 A | | 10/1999 | Ye et al. |
| 5,969,422 A | | 10/1999 | Ting et al. .................. 257/762 |
| 6,015,749 A | | 1/2000 | Liu et al. |
| 6,043,148 A | | 3/2000 | Peng et al. |
| 6,090,710 A | | 7/2000 | Andricacos et al. ........ 438/687 |
| 6,124,198 A | | 9/2000 | Moslehi ...................... 438/622 |
| 6,130,156 A | | 10/2000 | Havemann et al. |
| 6,181,012 B1 | | 1/2001 | Edelstein et al. ........... 257/762 |
| 6,218,734 B1 | | 4/2001 | Charneski et al. |
| 6,228,759 B1 | * | 5/2001 | Wang et al. ................. 438/625 |
| 6,287,977 B1 | | 9/2001 | Hashim et al. |
| 6,291,334 B1 | | 9/2001 | Somekh |
| 6,309,970 B1 | | 10/2001 | Ito et al. |
| 6,333,560 B1 | | 12/2001 | Uzoh .......................... 257/774 |
| 6,358,848 B1 | | 3/2002 | Lopatin ....................... 438/687 |
| 6,365,502 B1 | | 4/2002 | Paranjpe et al. |
| 6,365,506 B1 | | 4/2002 | Chang et al. |
| 6,387,805 B2 | | 5/2002 | Ding et al. |
| 6,498,093 B1 | | 12/2002 | Achuthan et al. |
| 6,518,177 B1 | | 2/2003 | Kawanoue et al. |
| 6,518,668 B2 | | 2/2003 | Cohen |
| 6,576,555 B2 | | 6/2003 | Tseng |

\* cited by examiner

*Primary Examiner*—Ha Tran Nguyen
(74) *Attorney, Agent, or Firm*—Haynes and Boone, LLP

(57) ABSTRACT

A new method is provided for the creation of a copper seed interface capability. A first seed layer of copper alloy and a second seed layer of copper is provided over an opening in a layer of dielectric. The opening is filled with copper, the first and second seed layers are annealed.

32 Claims, 4 Drawing Sheets

BARRIER FREE COPPER INTERCONNECT BY MULTI-LAYER COPPER SEED

BACKGROUND OF THE INVENTION (1) Field of the Invention

The invention relates to the fabrication of integrated circuit device, and more particularly, to a method of creating a copper interconnect without the need for a separate barrier layer.

(2) Description of the Prior Art

In the creation of semiconductor devices, the creation of conductive interconnects has become increasingly more important due to the continuing reduction in device parameters, a reduction that is driven by requirements of improved device performance. Metal is typically used for the creation of conducting interconnects comprising such materials as aluminum, tungsten, titanium copper polysilicon, polycide or alloys of these metal. For the creation of metal interconnects a Ti/TiN/AlCu/TiN process is the preferred method. Electrically conductive materials that can be used for the metal lines include but are not limited to Al, Ti, Ta, W, Mo, Cu, their alloys or a combination of these materials.

Due to increased requirements of low resistance of interconnect metal, copper has become more attractive as a material for the creation of interconnect metal. The invention relates to the fabrication of copper conductive lines and vias that provide the conductive interconnections of integrated circuits in semiconductor devices or the interconnections in a multilayer substrate over the surface of which semiconductor devices are mounted. More particularly, the fabrication of conductive lines and vias using damascene and dual damascene processes.

In fabricating Very and Ultra Large Scale Integration (VLSI and ULSI) circuits with the dual damascene process, an insulating or dielectric material, such as silicon oxide, of a semiconductor device is patterned with several thousand openings for the conductive lines and vias. These openings are filled at the same time with metal and serve to interconnect the active and passive elements of the integrated circuit. The dual damascene process also is used for forming multilevel conductive lines of metal, such as copper, in layers of insulating material, such as polyimide, of multi-layer substrates over which semiconductor devices are mounted.

Damascene is an interconnection fabrication process in which grooves are formed in an insulating layer and filled with metal to form the conductive lines. Dual damascene is a multi-level interconnection process in which, in addition to forming the grooves of single damascene, conductive via openings also are formed. In the standard dual damascene process, the insulating layer is coated with a layer of photoresist, which is exposed through a first mask with an image pattern of via openings, the via pattern is anisotropically etched in the upper half of the insulating layer. The photoresist now is exposed through a second mask with an image pattern of the conductive line openings or trenches, after being aligned with the first mask of the via pattern to encompass the via openings. By anisotropically etching the openings for the conductive lines in the upper half of the insulating material, the via openings already present in the upper half of insulating material are simultaneously etched and replicated in the lower half of the insulating material. After the etching is complete, both the vias and line openings are filled with metal. Dual damascene is an improvement over single damascene because it permits the filling of both the conductive grooves and vias with metal at the same time, thereby eliminating process steps.

Copper is being increasingly used as an interconnect metal due to its low cost and low resistivity. Copper however has a relatively large diffusion coefficient into surrounding dielectrics such as silicon dioxide and into silicon. Copper from an interconnect may diffuse into the silicon dioxide layer causing the dielectric to become conductive while decreasing the dielectric strength of the silicon dioxide layer. Copper interconnects are therefore typically encapsulated by at least one diffusion barrier, comprising for instance silicon nitride, to prevent diffusion into the silicon dioxide layer. Copper is known to have low adhesive strength to various insulating layers, masking and etching a blanket layer of copper layer presents a challenge.

To provide a starting material for electroplating of a copper interconnect line to the surrounding layer of dielectric or insulation, a seed layer is typically deposited over the barrier layer. The invention addresses this aspect of the creation of copper interconnects and provides a method that allows the creation of such copper interconnects without the need for a separate barrier layer.

U.S. Pat. No. 6,333,560 B1 (Uzoh) shows a barrier-less copper interconnect process.

U.S. Pat. No. 6,124,198 (Moslehi) shows a barrier-less interconnect process.

U.S. Pat. No. 6,358,848 B1 (Lopatin) shows a Ca doped Cu seed layer.

U.S. Pat. No. 6,181,012 B1 (Edelstien et al.) shows a barrier-less copper process.

U.S. Pat. No. 6,090,710 (Andricacos et al.) and U.S. Pat. No. 5,969,422 (Ting et al.) are related copper interconnect patents.

SUMMARY OF THE INVENTION

A principle objective of the invention is to provide a method of forming an underlying layer for copper interconnects.

A new method is provided for the creation of a copper interface. A first seed layer of copper alloy and a second seed layer of copper is provided over an opening in a layer of dielectric. The opening is filled with copper, the first and second seed layers are annealed.

DESCRIPTION OF THE PREFERRED EMBODIMENTS

Copper, as previously stated, suffers from high diffusivity in common insulating materials such as silicon oxide and oxygen-containing polymers. For instance, copper tends to diffuse into polyimide during high temperature processing of the polyimide.

This causes severe corrosion of the copper and the polyimide due to the copper combining with oxygen in the polyimide. This corrosion may result in loss of adhesion, delamination, voids, and ultimately a catastrophic failure of the component. Copper interconnects are therefore conventionally encapsulated in at least one diffusion barrier to prevent diffusion into the surrounding layer of dielectric such as a layer of silicon dioxide. A typical barrier layer is formed using rf. sputtering of titanium nitride, tantalum, tungsten, niobium, molybdenum, Ti/TiN or Ti/W and is more preferably formed using TiN. The barrier layer can also be used to improve the adhesion of the subsequent overlying tungsten layer. A barrier layer is preferably about 100 and 500 Angstrom thick and more preferably about 300 angstrom thick. The addition of a barrier layer has a negative impact on device performance by increasing contact resistance and series resistance of the in this manner created copper interconnect. These negative effects are to be avoided, more so in the era of sub-micron and deep sub-micron device feature sizes since this negative impact has a proportionally larger negative impact on these devices.

To further enhance the adhesion of a copper interconnect line to the surrounding layer of dielectric or insulation, a seed layer is typically deposited over the barrier layer. A conventional seed layer can be deposited using a sputter chamber or an Ion Metal Plasma (IMP) chamber at a temperature of between about 0 and 300 degrees C. and a pressure of between about 1 and 100 mTorr, using copper or a copper alloy as the source at a flow rate of between about 10 and 400 sccm and using argon as an ambient gas. The minimum thickness of a seed layer is about 50 Angstrom, this thickness is required to achieve a reliable gap fill.

Figure 1:
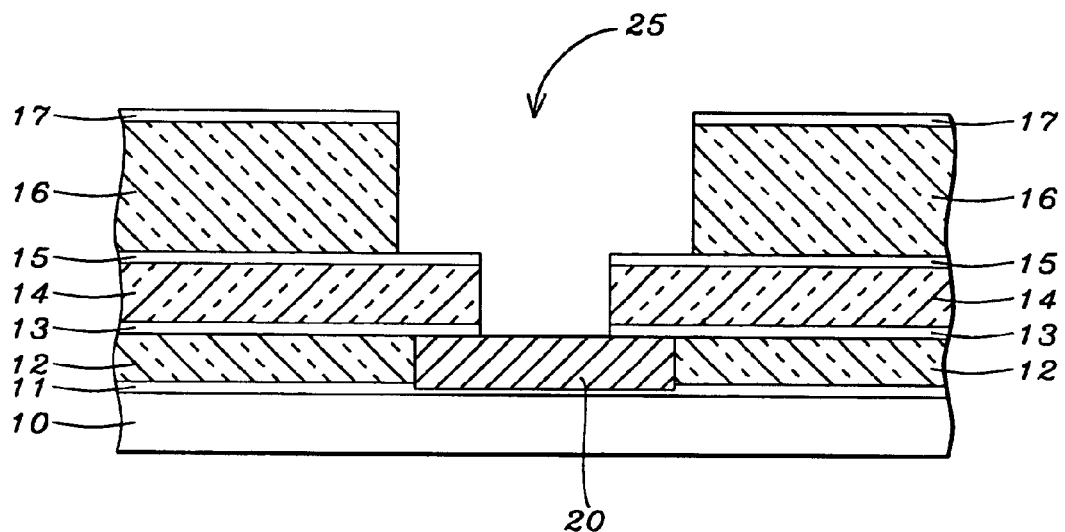
FIG. 1 shows a cross section of a semiconductor substrate over the surface of which a first level of metal is available, layers of dielectric have been deposited, an opening for a copper interconnect has been created through the multiple payers of dielectric. The created opening has a cross section of a dual damascene structure.

The invention, shown using FIGS. 1 through 7, starts with, FIG. 1, a blanket unprocessed semiconductor substrate 10 over the surface of which is created a interconnect structure through successive overlying layers of dielectric.

Shown in the cross section of FIG. 1 are a layer 11 which represents the layer of semiconductor devices that is created in or over the surface of substrate 10. The electrical point of first level copper contact 20 is representative of the points of electrical contact provided in the surface of substrate 10 that provide access to the semiconductor devices created in or over the surface of substrate 10 as represented by layer 11.

Further shown in the cross section of FIG. 1 are a first layer 12 of dielectric, a second layer 14 of dielectric and a third layer 16 of dielectric. Overlying the three layers of dielectric are a first layer 13 of etch stop material, a second layer 15 of etch stop material and a third layer 17 of etch stop material. Opening 25, created through the layers of dielectric and etch stop material as shown in the cross section of FIG. 1, will be recognized as having the cross section of a dual damascene structure. Conventional methods of photolithographic exposure and development are used to create opening 25, opening 25 exposes the surface of copper contact point 20.

Layers 12, 14 and 16 of dielectric are preferably formed using a low-k dielectric material.

Figure 2:
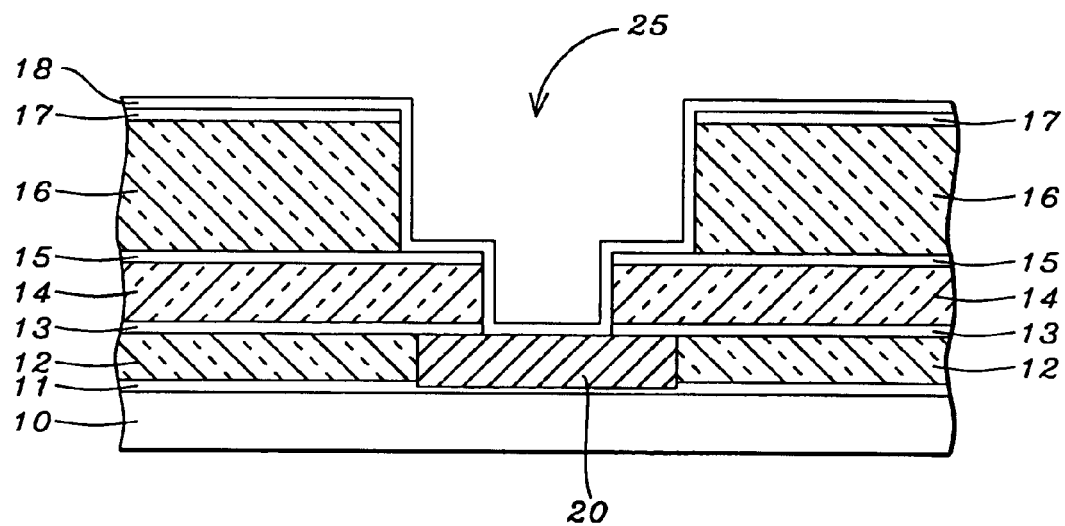
FIG. 2 shows the cross section of the semiconductor substrate after layer of copper alloy has been deposited as a first seed layer.

As a next step, FIG. 2, a layer 18 is deposited over inside surface of opening 25 and over the surface of the patterned and etched layers of dielectric. Layer 18, of critical importance to the invention, is one of the two layers that replace the conventional seed layer between a thereover to be created copper interconnect and the surrounding layers of dielectric. Layer 18 is therefore referred to as a first seed layer. Layer 18 of the invention comprises a copper alloy layer, deposited using methods of CVD, to a preferred thickness of between about 50 and 300 Angstrom.

The copper alloy layer 18 may, herewith highlighting doping materials as examples without thereby being limited to these materials, be doped by Cr, Pd, Sn, Ti, Zr, Mg, Al, whereby all of these materials have as common characteristic that these materials prevent oxidation of the surface of a thereover deposited copper seed layer. The copper alloy layer 18 therefor may comprise CuCr, CuPd, CuSn, etc., in accordance with the listed doping elements.

Figure 3:
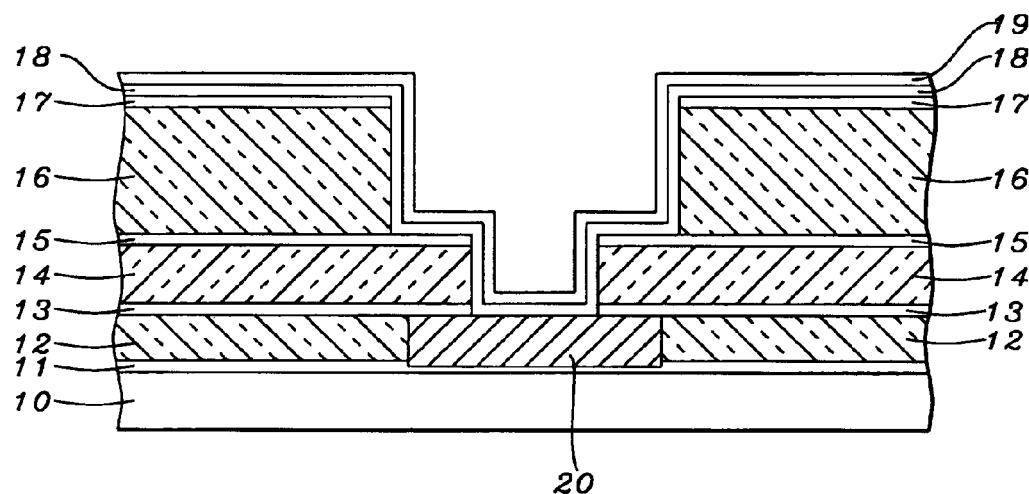
FIG. 3 shows a cross section after a thin seed layer of copper has been deposited.

As a next step, shown in cross section in FIG. 3, a layer 19 of copper seed material is deposited over the surface of the copper alloy layer 18, this deposition is performed to a preferred thickness of between about 300 and 800 Angstrom. Layer 19 is referred to as a second seed layer for a thereover to be created copper interconnect. The first seed layer 18 combined with the second seed layer 19 form a copper seed layer, this combined copper seed layer is preferred to be created to a thickness between about 800 and 1,200 Angstrom.

Figure 4:
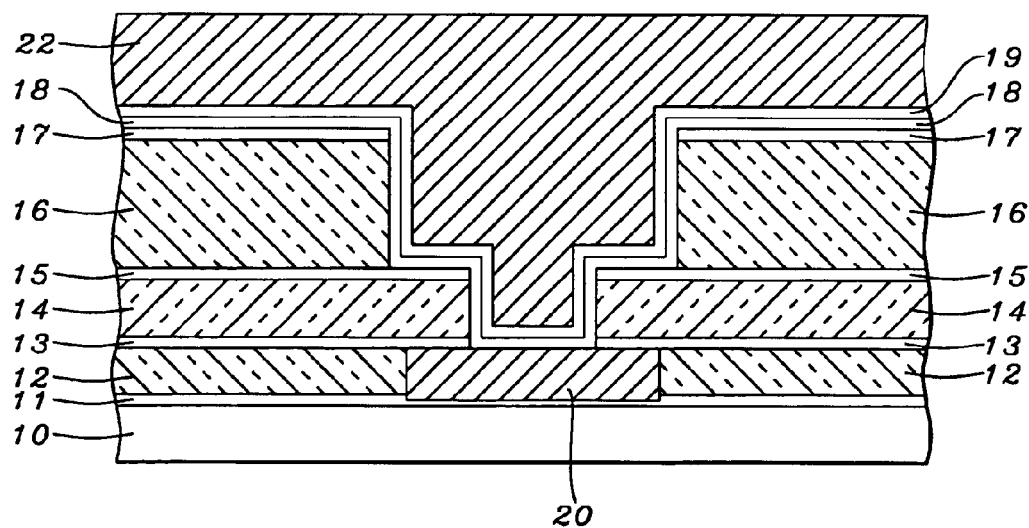
FIG. 4 shows a cross section after a layer of copper has been deposited over the second seed layer, filling the opening created through the layers of dielectric.

The structure that is shown in cross section in FIG. 3 is now ready for the deposition of a layer 22, FIG. 4, of copper thereover, using conventional methods of metal deposition such as ECP, filling opening 25 in addition to depositing copper over the surface of layer 19 of copper seed.

After the structure that is shown in cross section in FIG. 4 has been created, a Rapid Thermal Anneal is applied to the structure that is shown in cross section in FIG. 4, resulting in copper stabilization and the stimulation of an interaction between the doped elements in layer 18 and the sidewalls of the dielectrics 14 and 16. This interaction forms, in the interface between layer 18 and the surrounding dielectrics 14 and 16 of low-k dielectric material, oxide compounds such as $MgO_x$, $AlO_x$, $HfO_x$, $TiO_x$, $ZrO_x$ and the like, dependent on the doping element that has been provided as a dopant in layer 18.

The Rapid Thermal Anneal can be performed applying a temperature of no less than about 350 degrees C. for a time of no less than about 10 minutes.

Figure 5:
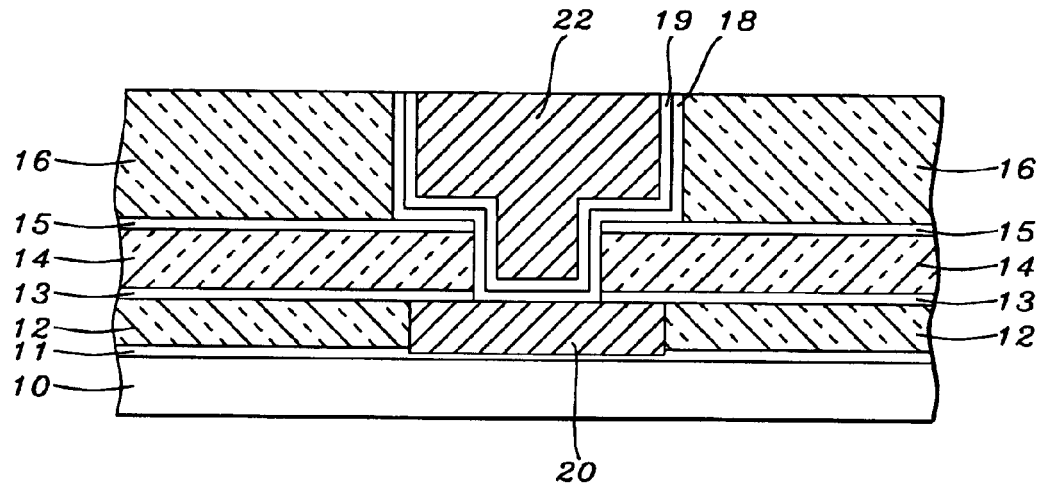
FIG. 5 shows a cross section after polishing of the deposited layer of copper, including the first and second seed layers over the surface of the layers of dielectric.

By now removing the deposited layer 22 of copper and the layers 18/19 of doped copper and copper seed from above the surface of layer 16 of dielectric, applying for this purpose preferably methods of Chemical Mechanical Polishing (CMP), the structure that is shown in cross section in FIG. 5 is obtained.

The layer that interfaces between the created copper interconnect 22, FIG. 5, and the surrounding layers of dielectrics 14 and 16 replaces the conventional barrier/seed layer, and performs the conventional function of barrier layer over which a seed layer is deposited. The need for a conventional barrier layer surrounding the created copper interconnect 22, FIG. 5, is therefore removed.

Figure 6:
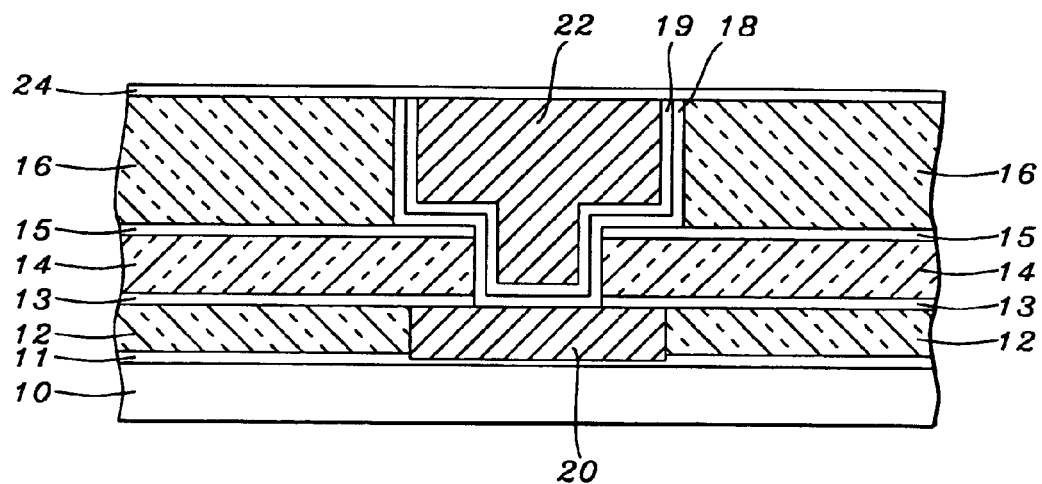
FIG. 6 shows a cross section after a cap layer has been deposited over the surface of the layers of dielectric, including the surface of the therein created copper interconnect.

As final steps of the invention, FIG. 6, a cap layer 24 can be created over the surface of the created copper interconnect 22 and the top layer 16 of low-k dielectric.

Figure 7:
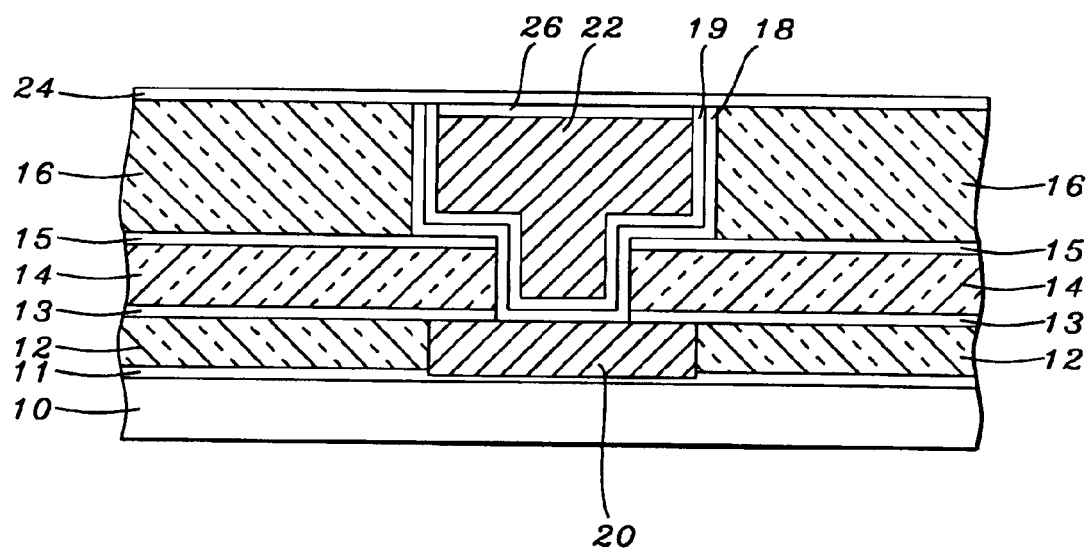
FIG. 7 shows a cross-section after the step of anneal has been completed.

The cap layer 24 may further interact with the underlying layer 22 of copper and form a layer 26, FIG. 7, between the cap layer 24 and the underlying copper interconnect 22, further protecting the surface of copper layer 22. Layer 26 forms only if SiC is used for cap layer 24, no cap layer 26 will form if for instance SiN is used for the cap layer 24, this due to enablement of chemical interaction between the cap layer 24 and the underlying layer 22 of copper, which is dependent on the chemical composition of the interfacing materials.

It must be pointed out that the doping element and the concentration of the doping element in the first seed layer 18 must be carefully controlled. If the level of doping in the first seed layer 18 is too high, severe leakage may be introduced by the doping element and originating in the created interconnect 22 of copper.

It must further be pointed out the whereas the cross sections htat are shown in FIGS. 1–7 address the deposition of one copper alloy layer over which one copper layer is deposited, the invention is not limited to depositing only two layers for the creation of a barrier-free layer of material surrounding a copper interconnect. Multiple layers of copper alloy may be used for this purpose in combination with multiple layers of copper seed.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method for creation of a barrier-free interconnect that includes copper, comprising:
   providing an opening in a layer of dielectric, over a semiconductor substrate;
   providing a first seed layer comprising copper alloy over sidewalls of said opening;
   providing a second seed layer comprising copper over the surface of said first seed layer;
   filling said opening with an interconnect material that includes copper, creating an interconnect surrounded by the first and second seed layers; and
   annealing said first and second seed layers, creating a barrier-less seed layer around said interconnect.

2. The method of claim 1, said annealing comprising applying a temperature of no less than about 350 degrees C. for a time of no less than about 10 minutes.

3. The method of claim 1, said copper alloy comprising copper alloyed with a material selected from the group consisting of Cr and Pd and Sn and Ti and Zr and Mg and Al and Co.

4. The method of claim 1, additionally forming a cap layer over the surface of the layer of dielectric, including the surface of the created interconnect.

5. The method of claim 4, the cap layer comprising SiC or SiN.

6. The method of claim 1, said first seed layer being provided to a thickness between about 50 and 300 Angstrom.

7. The method of claim 1, said second seed layer being provided to a thickness between about 300 and 800 Angstrom.

8. The method of claim 1, further comprising removing the interconnect material and the first and second seed layers from the surface of the layer of dielectric.

9. The method of claim 8, the removing of the interconnect material and the first and second seed layers from the surface of the layer of dielectric comprising methods of Chemical Mechanical Polishing.

10. The method of claim 1, the layer of dielectric comprising a low-k dielectric.

11. The method of claim 1, the opening comprising a dual damascene opening.

12. A method for the creation of a barrier-free interconnect that includes copper, comprising steps of:
   providing an opening in a layer of dielectric, over a semiconductor substrate;
   depositing a first seed layer comprising copper alloy over the surface of the layer of dielectric, including inside surface of said opening;
   depositing a second seed layer comprising copper over the surface of the first seed layer;
   depositing a layer of interconnect material that includes copper over the second seed layer;
   annealing said first and second seed layers; and
   removing the layer of interconnect material and the first and second seed layers from the surface of the layer of dielectric.

13. The method of claim 12, further comprising forming a cap layer over the surface of the layer of dielectric, including the surface of the created copper interconnect.

14. The method of claim 13, the cap layer comprising SiC or SiN.

15. The method of claim 12, the copper alloy comprising copper alloyed with a material selected from the group consisting of Cr and Pd and Sn and Ti and Zr and Mg and Al and Co.

16. The method of claim 12, the layer of dielectric comprising a low-k dielectric.

17. The method of claim 12, the opening comprising a dual damascene opening.

18. A method for the creation of a barrier-free interconnect that includes copper, comprising steps of:
   providing an opening in a first layer of dielectric, over a semiconductor substrate;
   providing at least one first layer of copper alloy over inside surfaces of the opening;
   providing at least one second layer of copper over the first layer of the copper alloy;
   providing a third layer of interconnect material that includes copper over the surface of said second layer of copper;
   annealing said first layer of copper alloy and the second layer of copper by applying a temperature of no less than about 350 degrees C. for a time of no less than about 10 minutes, thereby diffusing doping elements of said first layer of copper alloy, creating a barrier-less seed layer surrounding the interconnect material;
   polishing the surface of said deposited third layer of interconnect material, removing said at least one first layer of copper alloy and said at least one second layer of copper and said third layer of interconnect material from the surface of said first layer of dielectric, creating an interconnect in said first layer of dielectric; and
   depositing a second layer of dielectric over the surface of the first layer of dielectric, including the surface of the interconnect created in the first layer of dielectric.

19. The method of claim 18, said at least one first layer of copper alloy comprising copper alloyed with a material selected from the group consisting of Cr and Pd and Sn and Ti and Zr and Mg and Al and Co.

20. The method of claim 18, first and second layers of dielectric each comprising a low-k dielectric.

21. The method of claim 18, additionally forming a cap layer over the surface of the first layer of dielectric, including the surface of the created interconnect, prior to depositing a second layer of dielectric over the surface of the first layer of dielectric.

22. The method of claim 21, the cap layer comprising SiC or SiN.

23. The method of claim 18, the opening comprising a dual damascene opening.

24. A method for creation of a barrier-free interconnect that includes copper, comprising:
   providing an opening in a layer of dielectric, over a semiconductor substrate;
   depositing an interface layer over the surface of the layer of dielectric and inside surfaces of the opening, the interface layer comprising:
      (i) at least one first seed layer comprising copper alloy;
      (ii) at least one second seed layer comprising copper;
   depositing a layer of interconnect material that includes copper over the interface layer;
   annealing the interface layer; and
   removing the layer of interconnect material and the interface layer from the surface of the layer of dielectric.

25. The method of claim 24, the copper alloy comprising copper alloyed with a material selected from the group consisting of Cr and Pd and Sn and Ti and Zr and Mg and Al and Co.

26. The method of claim 24, the annealing comprising applying a temperature of no less than about 350 degrees C. for a time of no less than about 10 minutes, creating a barrier-less seed layer around said interconnect material.

27. The method of claim 24, additionally forming a cap layer over the surface of the layer of dielectric, including the surface of the created interconnect.

28. The method of claim 27, the cap layer comprising SiC or SiN.

29. The method of claim 24, the at least one first seed layer being deposited to a thickness between about 50 and 300 Angstrom.

30. The method of claim 24, the at least one second seed layer being deposited to a thickness between about 300 and 800 Angstrom.

31. The method of claim 24, the removing the layer of interconnect material and the interface layer from the surface of the layer of dielectric comprising methods of Chemical Mechanical Polishing.

32. The method of claim 24, the opening comprising a dual damascene opening.

* * * * *